United States Patent
Suzuki

(10) Patent No.: US 9,506,989 B2
(45) Date of Patent: Nov. 29, 2016

(54) BATTERY REMAINING AMOUNT DETECTION UNIT, ELECTRIC VEHICLE, AND ELECTRIC POWER SUPPLY UNIT

(71) Applicant: Sony Corporation, Tokyo (JP)

(72) Inventor: Isao Suzuki, Fukushima (JP)

(73) Assignee: Sony Corporation, Tokyo (JP)

( * ) Notice: Subject to any disclaimer, the term of this patent is extended or adjusted under 35 U.S.C. 154(b) by 393 days.

(21) Appl. No.: 14/081,321

(22) Filed: Nov. 15, 2013

(65) Prior Publication Data

US 2014/0159737 A1  Jun. 12, 2014

(30) Foreign Application Priority Data

Dec. 6, 2012 (JP) ................. 2012-267002

(51) Int. Cl.
*G01R 31/36* (2006.01)

(52) U.S. Cl.
CPC ......... *G01R 31/362* (2013.01); *G01R 31/3651* (2013.01); *G01R 31/3658* (2013.01)

(58) Field of Classification Search
USPC ....................................................... 324/429
See application file for complete search history.

(56) References Cited

U.S. PATENT DOCUMENTS

| | | | |
|---|---|---|---|
| 2003/0210056 A1* | 11/2003 | Arai | G01R 31/3648 324/430 |
| 2006/0202663 A1* | 9/2006 | Cho | G01R 31/3675 320/132 |
| 2010/0318252 A1* | 12/2010 | Izumi | B60K 6/28 701/22 |

\* cited by examiner

*Primary Examiner* — Richard Isla Rodas
*Assistant Examiner* — David V Henze-Gongola
(74) *Attorney, Agent, or Firm* — Chip Law Group

(57) ABSTRACT

A battery remaining amount detection unit includes: a voltage measurement section configured to measure a voltage of a battery; an open-circuit voltage calculation section configured to calculate an estimated open-circuit voltage; and a remaining amount detection section configured to detect a remaining amount of the battery from the estimated open-circuit voltage, in which the open-circuit voltage calculation section is configured to calculate a first voltage change amount as a voltage change amount from a no-load voltage when no load is applied to the battery and a closed-circuit voltage when a load is applied to the battery, and the open-circuit calculation section is configured to calculate the estimated open-circuit voltage based on the closed-circuit voltage of the battery and the first voltage change amount.

12 Claims, 7 Drawing Sheets

BATTERY REMAINING AMOUNT DETECTION UNIT, ELECTRIC VEHICLE, AND ELECTRIC POWER SUPPLY UNIT

CROSS REFERENCE TO RELATED APPLICATIONS

This application claims the benefit of Japanese Priority Patent Application JP 2012-267002 filed Dec. 6, 2012, the entire contents which are incorporated herein by reference.

BACKGROUND

The present disclosure relates to a battery remaining amount detection unit, an electric vehicle, and an electric power supply unit.

Secondary batteries that are repeatedly chargeable and dischargeable, for example, lithium-ion secondary batteries are widely used as power sources in a field of power of electric vehicles, hybrid vehicles, electric motorcycles, electrically-assisted bicycles, and the like, and a field of storage for load leveling, peak shift, backup, and the like.

When a battery is used, an electric charge in the battery is discharged to reduce a remaining amount of the battery; therefore, it is necessary to charge the battery at some point. When the battery is continuously used under a state in which the remaining amount of the battery (hereinafter referred to as "remaining amount", as necessary) is reduced, a failure of or damage to the battery may result to cause an accident. Moreover, in a case where the battery is used as power of an electric car, if the remaining amount is not accurately kept track of, the battery may suddenly run out to put the electric car out of action. Therefore, it is extremely important to accurately keep track of the remaining amount.

As a method of keeping track of the remaining amount, a method of integrating an electric current when a battery is charged and discharged with use of an electric current measurement unit such as a coulomb meter is known.

As another method, as described in Japanese Unexamined Patent Application Publication (Published Japanese Translation of PCT Application) No. 2010-523971, a method of calculating a remaining amount of a battery from an open-circuit voltage of the battery is proposed.

SUMMARY

In the method described in Japanese Unexamined Patent Application Publication (Published Japanese Translation of PCT Application) No. 2010-523971, an open-circuit voltage of the battery at present is estimated by reflecting an amount of change in estimated open-circuit voltage on an open-circuit voltage of the battery estimated at a previous stage. In such a method of estimating an open-circuit voltage described in Japanese Unexamined Patent Application Publication (Published Japanese Translation of PCT Application) No. 2010-523971, a complicated process is necessary.

Therefore, it is desirable to provide a battery remaining amount detection unit, an electric vehicle, and an electric power supply unit that are capable of solving such an issue and simplifying a process.

According to an embodiment of the present disclosure, there is provided a battery remaining amount detection unit including: a voltage measurement section configured to measure a voltage of a battery; an open-circuit voltage calculation section configured to calculate an estimated open-circuit voltage; and a remaining amount detection section configured to detect a remaining amount of the battery from the estimated open-circuit voltage, in which the open-circuit voltage calculation section is configured to calculate a first voltage change amount as a voltage change amount from a no-load voltage when no load is applied to the battery and a closed-circuit voltage when a load is applied to the battery, and the open-circuit calculation section is configured to calculate the estimated open-circuit voltage based on the closed-circuit voltage of the battery and the first voltage change amount.

According to an embodiment of the present disclosure, there is provided an electric vehicle including: a voltage measurement section configured to measure a voltage of a battery for generating a driving force of a vehicle; an open-circuit voltage calculation section configured to calculate an estimated open-circuit voltage; and a remaining amount detection section configured to detect a remaining amount of the battery from the estimated open-circuit voltage, in which the open-circuit voltage calculation section is configured to calculate a first voltage change amount as a voltage change amount from a no-load voltage when no load is applied to the battery and a closed-circuit voltage when a load is applied to the battery, and the open-circuit calculation section is configured to calculate the estimated open-circuit voltage based on the closed-circuit voltage of the battery and the first voltage change amount.

According to an embodiment of the present disclosure, there is provided an electric power supply unit including: a voltage measurement section configured to measure a voltage of a battery used to generate AC electric power; an open-circuit voltage calculation section configured to calculate an estimated open-circuit voltage; and a remaining amount detection section configured to detect a remaining amount of the battery from the estimated open-circuit voltage, in which the open-circuit voltage calculation section is configured to calculate a first voltage change amount as a voltage change amount from a no-load voltage when no load is applied to the battery and a closed-circuit voltage when a load is applied to the battery, and the open-circuit calculation section is configured to calculate the estimated open-circuit voltage based on the closed-circuit voltage of the battery and the first voltage change amount.

According to the embodiments of the present disclosure, a current measurement unit and a current integrator are not necessary; therefore, a remaining amount measurement unit is achievable at low cost. Moreover, remaining amount detection with smaller error, compared to a current integration system is achievable. Further, a process of estimating an open-circuit voltage of the battery is simple.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the technology, and are incorporated in and constitute a part of this specification. The drawings illustrate embodiments and, together with the specification, serve to explain the principles of the technology.

DETAILED DESCRIPTION

Figure 1:
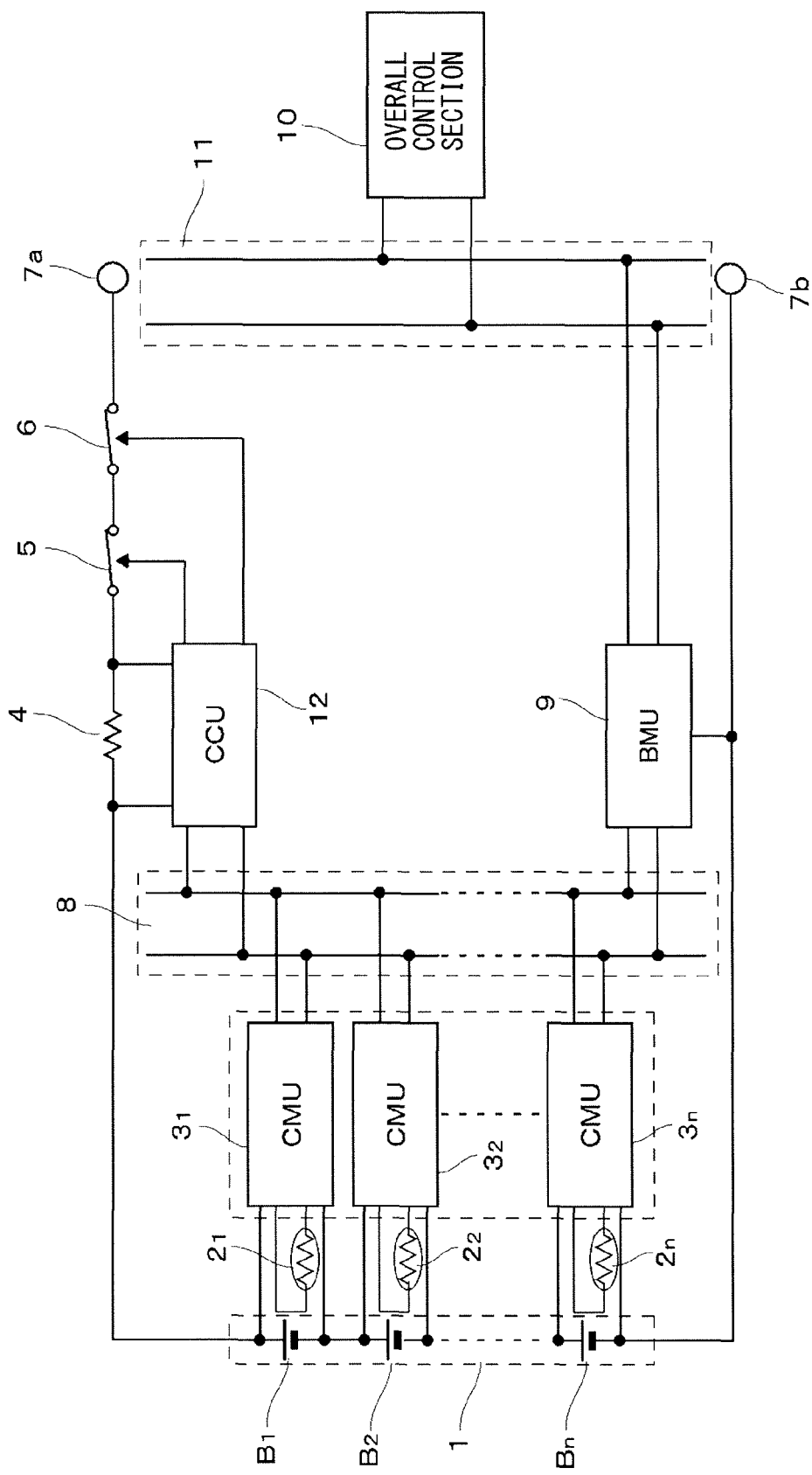
FIG. 1 is a block diagram of a remaining amount detection unit according to an embodiment of the present disclosure.

Although embodiments described hereinafter are preferred specific examples of the present disclosure with technically preferred various limitations, the scope of the present disclosure is not limited to the embodiments unless it is especially described to limit the present disclosure in the following description.

(Example of Lithium-Ion Secondary Battery)

An example of a battery used in an embodiment of the present disclosure is a lithium-ion secondary battery including a cathode active material and graphite as an anode active material. Although a cathode material is not specifically limited, the cathode material may preferably include a cathode active material with an olivine structure. As the cathode active material with an olivine structure, a lithium iron phosphate compound ($LiFePO_4$), or a lithium iron complex phosphate compound containing a hetero atom ($LiFe_xM_{1-x}O_4$, where M is one or more kinds of metals, and x is $0<x<1$) may be more preferable. Moreover, in a case where M includes two or more kinds of metals, the two or more kinds of metals are so selected as to allow a total of respective numerical subscripts to be equal to 1−x. As M, transition elements, group IIA elements, group IIIA elements, group IIIB elements, group IVB elements, and the like may be used. In particular, one or more kinds selected from a group configured of cobalt (Co), nickel, manganese (Mn), iron, aluminum, vanadium (V), and titanium (Ti) may be preferably included in M.

In the cathode active material, a surface of the lithium iron phosphate compound or the lithium iron complex phosphate compound may be coated with a coating layer including a metal oxide (for example, an oxide including Ni, Mn, Li, or the like), a phosphate compound (for example, lithium phosphate), or the like with a composition different from the lithium iron phosphate compound or the lithium iron complex phosphate compound.

Graphite used herein is not specifically limited, and graphite materials used in industry may be widely used.

A method of manufacturing an electrode of the battery in the embodiment of the present disclosure is not specifically limited, and methods used in industry may be widely used.

A battery configuration in the embodiment of the present disclosure is not specifically limited, and known configurations may be widely used.

An electrolytic solution used in the embodiment of the present disclosure is not specifically limited, and liquid and gel electrolytic solutions used in industry may be widely used.

As a solvent of the electrolytic solution, 4-fluoro-1,3-dioxolane-2-one (FEC), ethylene carbonate, propylene carbonate, butylene carbonate, vinylene carbonate (VC), dimethyl carbonate, diethyl carbonate, ethyl methyl carbonate, γ-butyrolactone, γ-valerolactone, 1,2-dimethoxyethane, tetrahydrofuran, 2-methyltetrahydrofuran, 1,3-dioxolane, 4-methyl-1,3-dioxolane, methyl acetate, methyl propionate, ethyl propionate, acetonitrile, glutaronitrile, adiponitrile, methoxyacetonitrile, 3-methoxypropionitrile, N,N-dimethyl formamide, N-methylpyrrolidinone, N-methyloxazolidinone, nitromethane, nitroethane, sulfolane, dimethyl sulfoxide, trimethyl phosphate, triethyl phosphate, ethylene sulfide, and trimethyl(hexyl)ammonium bis((trifluoromethyl)sulfonyl)imide may be preferable, and 4-fluoro-1,3-dioxolane-2-one (FEC), ethylene carbonate, propylene carbonate, butylene carbonate, vinylene carbonate (VC), dimethyl carbonate, diethyl carbonate, ethyl methyl carbonate, γ-butyrolactone, and γ-valerolactone may be more preferable.

As an electrolytic solution-supporting electrolyte, lithium hexafluorophosphate ($LiPF_6$), lithium bis(pentafluoroethanesulfonyl)imide ($Li(C_2F_5SO_2)_2N$), lithium perchlorate ($LiClO_4$), lithium hexafluoroarsenate ($LiAsF_6$), lithium tetrafluoroborate ($LiBF_4$), lithium trifluoromethanesulfonate ($LiSO_3CF_3$), lithium bis(trifluoromethanesulfonyl)imide ($Li(CF_3SO_2)_2N$), and tris(trifluoromethanesulfonyl)methyl lithium ($LiC(SO_2CF_3)_3$) may be preferable.

(Configuration of Remaining Amount Measurement Unit)

An example of a configuration of a remaining amount measurement unit will be described below referring to FIG. 1. An electric storage apparatus according to an embodiment of the present disclosure may be mounted in, for example, an electric car. The embodiment of the present disclosure is applicable to home electric storage apparatuses, and power sources of mobile electronic apparatuses and the like, in addition to the electric car. FIG. 1 illustrates a configuration of one battery module, and an electric storage apparatus is configured of a plurality of the battery modules. A battery section 1 has a configuration in which an n-number of battery blocks $B_1$ to $B_n$ are connected to one another in series.

One battery block is configured of a plurality of electric storage devices, for example, 16 unit cells (that are also called "electric cells" or "cells"; hereinafter referred to as "battery cells", as necessary) connected to one another in parallel. The battery cells each have, for example, the above-described configuration. The embodiment of the present disclosure is applicable to nickel metal hydride batteries in addition to lithium-ion secondary batteries. The battery section 1 and a control circuit are contained in an outer case to configure a battery module (that is also called "assembled battery"). A control unit (hereinafter referred to as "overall control section", as necessary) 10 common to the plurality of battery modules is further included in the battery module.

An output terminal 7a is drawn from a cathode side of the battery section 1 through a resistor 4, a charge switch 5, and a discharge switch 6, and an output terminal 7b is drawn from an anode side of the battery section 1. A load is connected to the output terminals 7a and 7b. For example, in a case of an electric car, an AC motor is connected to the output terminals 7a and 7b through an inverter. An output from the AC motor rotates wheels through a reduction gear.

Temperature detection devices $2_1$ to $2_n$ such as thermistors and cell management units $3_1$ to $3_n$ (represented by "CMU" in FIG. 1) are connected to the battery blocks $B_1$ to $B_n$ of the battery section 1, respectively. Information on temperatures detected by the temperature detection devices $2_1$ to $2_n$ is supplied to the cell management units $3_1$ to $3_n$ respectively.

The cell management units $3_1$ to $3_n$ each include a microcontroller unit, and constantly measure open-circuit voltages and closed-circuit voltages of the battery blocks $B_1$ to $B_n$, respectively, and convert measured values into digital data by an A/D converter. The temperatures of the battery blocks $B_1$ to $B_n$ are constantly detected by the temperature detection devices $2_1$ to $2_n$ respectively, and information on detected temperatures is converted into digital data by the cell management units $3_1$ to $3_n$.

Voltage data and temperature data detected by the cell management units $3_1$ to $3_n$ are transmitted to a battery management unit 9 (represented by "BMU" in FIG. 1) through a communication section 8. The battery management unit 9 is connected to the overall control section 10 as an overall control unit through a communication section 11, and the overall control section 10 performs charge management, discharge management, and management of remaining amount detection and the like. Each of the battery management unit 9 and the overall control section 10 includes a microcontroller unit.

Moreover, a current measurement section 12 (represented by "CCU" (coulomb-counter-unit) in FIG. 1) including a microcontroller unit is included. A current value is converted into digital data by the current measurement section 12, and the digital data is transmitted to the battery management unit 9 through the communication section 8. The current measurement section 12 controls the charge switch 5 or the discharge switch 6 in response to a control signal from the battery management unit 9 for charge management or discharge management.

As the communication sections 8 and 11, for example, buses may be used. As the buses, serial interfaces may be used. As specific serial interfaces, SM buses (System Management Buses), CANs (Controller Area Networks), SPIs (Serial Peripheral Interfaces), or the like may be used.

The battery management unit 9 of each battery module and the overall control section 10 carry out communications therebetween. Information on an internal state of each electric storage module, that is, battery information such as a voltage of each battery block, a voltage of an entire module, a current, and a temperature is transmitted from the battery management unit 9 to the overall control section 10 to manage a charging process and a discharging process on each battery module. Moreover, the overall control section 10 receives information on a remaining amount calculated by the battery management unit 9 through the communication section 11, and displays the information on the remaining amount on a display unit.

The battery management unit 9 calculates a remaining amount of each battery module (the battery section 1), and transmits data of the calculated remaining amount to the overall control section 10. Although the remaining amounts of the battery blocks $B_1$ to $B_n$ of the battery section 1 are not always equal to one another, the remaining amount of a battery block having the lowest remaining amount among the battery blocks $B_1$ to $B_n$ is calculated. Although remaining amounts of a plurality of battery modules are not always equal to one another, the remaining amount of a battery module having the lowest remaining amount among the plurality of battery modules is calculated.

The cell management units $3_1$ to $3_n$ measure open-circuit voltages and closed-circuit voltages of the battery blocks $B_1$ to $B_n$, respectively. The open-circuit voltage is a voltage of a battery (a battery block) when a current does not flow, and the closed-circuit voltage is a voltage of a battery (a battery block) when a current flows. One of methods of measuring these two kinds of voltages by the cell management units $3_1$ to $3_n$ is a method of controlling ON/OFF states of the charge switch 5 and the discharge switch 6.

In the embodiment of the present disclosure, a motor as power of a vehicle is assumed as a load; therefore, a voltage when the motor stops and a current does not flow is measured as the open-circuit voltage, and a voltage when the motor rotates and a current flows is measured as the closed-circuit voltage. For example, a state signal presenting a rotation state or a stop state of the motor is supplied from the overall control section 10 to the battery management unit 9, and the battery management unit 9 is allowed to differentiate between the open-circuit voltage and the closed-circuit voltage. It is to be noted that the electric car includes a battery of 12 V in addition to the battery section 1, and some or more of the cell management units $3_1$ to $3_n$, the battery management unit 9, the overall control section 10, and the current measurement section 12 receive power from the battery of 12 V.

The battery management unit 9 calculates the remaining amount of the battery section 1. A nonvolatile memory included in the battery management unit 9 holds, in advance, a lookup table representing a relationship between an open-circuit voltage and a remaining amount of a battery cell in the battery section 1 by temperature. The battery management unit 9 calculates an estimated open-circuit voltage, and determines a remaining amount from the estimated open-circuit voltage and the temperature by referring to the lookup table. The determined remaining amount is informed to the overall control section 10. The lookup table is obtainable by measurement before shipment. A mathematical expression representing a correlation of the remaining amount with the open-circuit voltage may be used, other than actual measurement. Moreover, the lookup table may be formed with use of a combination of actual measurement and the mathematical expression. As an example, the lookup table is formed in steps of 1% in the estimated open-circuit voltage and in steps of 1° C. in temperature.

In a case where only one battery module is included, the overall control section 10 displays received information on the remaining amount on a display section or informs the received information to a user by a sound. In a case where information on the remaining amounts of a plurality of battery modules is received, information on the lowest remaining amount among the remaining amounts of the plurality of battery modules is presented. It is to be noted that, as the remaining amount, a SOC (State Of Charge), a DOD (Depth Of Discharge), or the like may be used.

(Example of Method of Measuring Remaining Amount)

Figure 2:
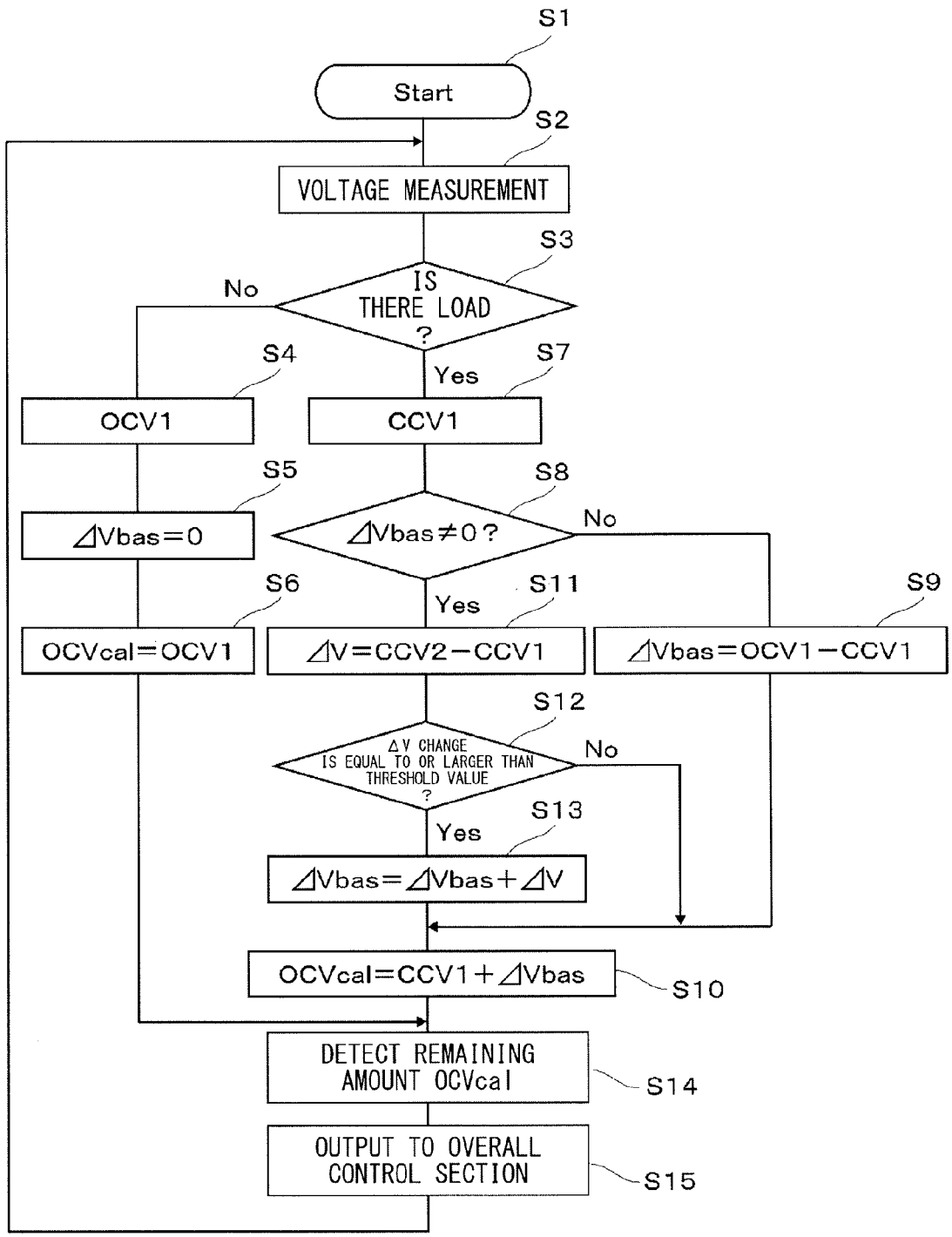
FIG. 2 is a flow chart illustrating a process of a method of detecting a remaining amount according to the embodiment of the present disclosure.

A method of measuring a remaining amount in the embodiment of the present disclosure will be described below referring to a flow chart in FIG. 2. A process illustrated in FIG. 2 is performed at a predetermined cycle by control by the microcontroller unit in the battery management unit 9. Moreover, although information necessary for the process is not specifically described, the information is stored in a memory, as necessary.

Meanings of notations in FIG. 2 are as follows:
OCV: Open-circuit voltage
CCV: Closed-circuit voltage
OCV1: Open-circuit voltage in a state where no load is applied
OCVcal: Estimated open-circuit voltage at present
CCV1: Closed-circuit voltage measured at present
CCV2: Closed-circuit voltage measured in a previous process
ΔV: Voltage change amount from CCV2 to CCV1
ΔVbas: Voltage change amount from a state where no load is applied to a state where a load is applied.

Step S2: When the process starts in step S1, the cell management unit 3 measures a voltage, and transmits the measured voltage to the battery management unit 9. In a case where the voltage is measured before discharge starts, an open-circuit voltage is obtained as a measured voltage.

Step S3: Whether or not a load is applied is determined. For example, an inverter is connected as a load, and a motor as a power source of the electric car is connected to an output of the inverter.

Step S4: When it is determined that no load is applied in the step S3, the actually measured voltage is considered as the open-circuit voltage OCV1.

Step S5: Since no load is applied, the voltage change amount ΔVbas from the state where no load is applied to a state where a load is applied is 0.

Step S6: Since ΔVbas is 0, an estimated open-circuit voltage OCVcal at present is considered as OCV1.

Step S14: Since the estimated open-circuit voltage OCVcal at present is determined, a remaining amount is detected from the estimated open-circuit voltage OCVcal by referring to the lookup table.

Step S15: Information on the detected remaining amount is output to the overall control section 10 to present the information on the remaining amount at present to a user. As a presenting method, notification by display, a sound, or the like may be adopted.

Step S7: When it is determined that there is a load in the step S3, the measured voltage is considered as the closed-circuit voltage CCV1 at present.

Step S8: Whether or not ΔVbas is 0 is determined

Step S9: When it is determined that ΔVbas is 0, there is no voltage change amount from the state where no load is applied to the state where a load is applied; therefore, a relationship of (ΔVbas=open-circuit voltage OCV1 at present−closed-circuit voltage CCV1 at present) is established.

Step S10: An estimated open-circuit voltage OCVcal is determined by (OCVcal=CCV1+ΔVbas). The estimated open-circuit voltage OCVcal is updated in such a manner.

The remaining amount is detected from the determined estimated open-circuit voltage OCVcal in the step S14. Then, in the step S15, information on the detected remaining amount is output to the overall control section 10 to present information on the remaining amount at present to the user.

Step S11: When it is determined that ΔVbas is not 0 in step S8, (ΔV=CCV2−CCV1) is computed, where CCV2 is a closed-circuit voltage measured in a previous process.

Step S12: A change ΔV in the close-circuit voltage determined in the step S12 is compared to a threshold value. A certain magnitude of the change ΔV in voltage is considered as a change ΔV in voltage caused by change in load. The threshold value is set to, for example, about 1% of the closed-circuit voltage. A value of 1% corresponds to steps in the estimated open-circuit voltage of the above-described lookup table.

Step S13: When it is determined that the change ΔV in voltage is equal to or larger than the threshold value, the voltage change amount ΔVbas is updated by (ΔVbas=ΔVbas+ΔV). However, when it is determined that the change ΔV in voltage is smaller than the threshold value, the voltage change amount ΔVbas is not updated.

Then, the process proceeds to the above-described step S10, and the estimated open-circuit voltage OCVcal is updated by (OCVcal=CCV1+ΔVbas). The remaining amount is detected from the updated estimated open-circuit voltage OCVcal in the step S14, and information on the detected remaining amount is transmitted to the overall control section 10 in the step S15. Then, the process returns to the step S2, and is repeated.

(Example of Estimation of Open-Circuit Voltage)

Figure 3:
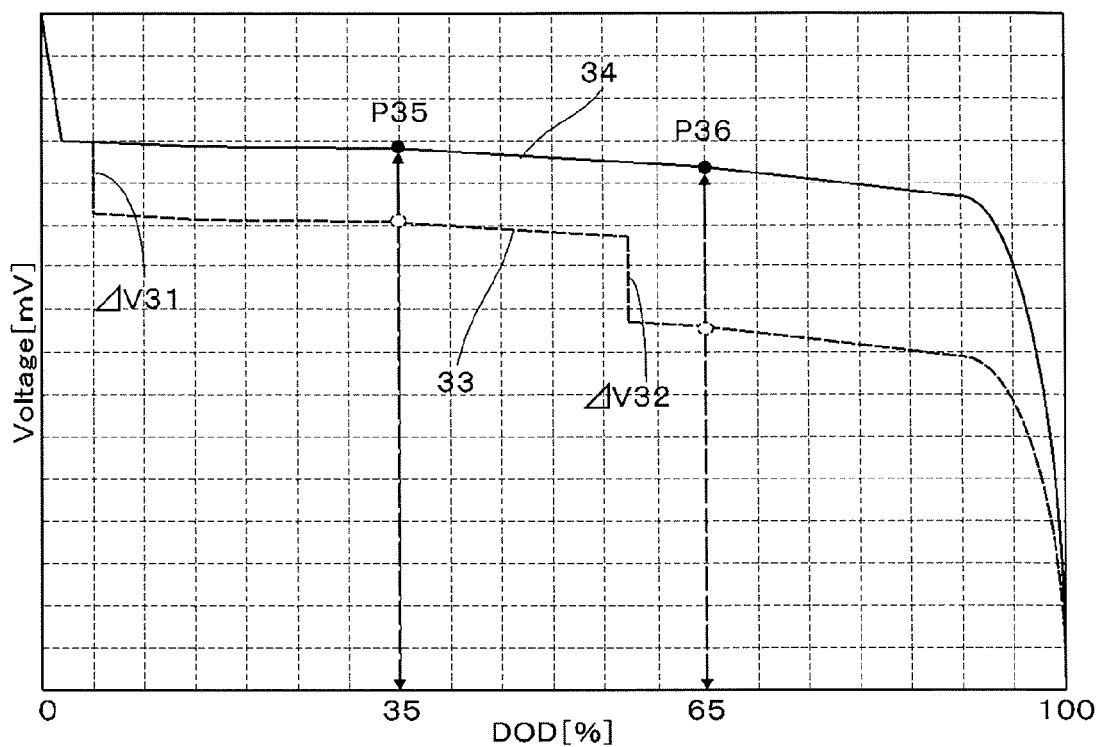
FIG. 3 is a graph for describing a method of detecting a remaining amount when a load is increased.

An example of Estimation of an open-circuit voltage will be described below referring to FIG. 3. As an example, an open-circuit voltage of one battery block is estimated. FIG. 3 illustrates a case where a load is increased (gets heavier) during discharge, and change in the closed-circuit voltage represented by a broken line 33 and change in open-circuit voltage represented by a solid line 34 are illustrated. The change (represented by the solid line 34) in the open-circuit voltage with respect to a DOD (a remaining amount) corresponds to a lookup table determined and stored in advance. The change in the open-circuit voltage corresponds to a measured temperature. The open-circuit voltage is estimated, and the DOD is allowed to be determined by the estimated open-circuit voltage.

First, the open-circuit voltage OCV1 before the load is connected (before discharge starts) is measured. For example, OCV1 is equal to 3300 mV. When the load is connected, and discharge starts, the measured voltage is reduced by ΔV31. The voltage ΔV31 is the voltage change amount ΔVbas from the state where no load is applied to the state where a load is applied. For example, ΔV31 is equal to (3300 mV−3140 mV=160 mV).

The closed-circuit voltage CCV1 at a point P35 after the load is connected is measured. For example, CCV1 is equal to 3100 mV. For example, a cycle of voltage measurement is extremely short, as with a sampling cycle in a case where voltage values in the cell management units $3_1$ to $3_n$ are A/D converted, and in FIG. 3, only representative measurement points are illustrated. When the closed-circuit voltage at a measurement point previous to the point P35 is considered as CCV2, under a state where the load is not changed, the voltage change amount is determined by (ΔV=CCV2−CCV1). The voltage change amount is smaller than the threshold value; therefore, the estimated open-circuit voltage OCVcal at the point P35 is determined by (CCV1+ΔVbas=3100 mV+160 mV=3260 mV). With reference to the lookup table, (DOD=35%) is detected from the estimated open-circuit voltage OCVcal.

When the load is changed during discharge, for example, the closed-circuit voltage is reduced with an increase in the load. A reduced amount is represented by ΔV32. Since the voltage change amount ΔV32 is larger than the threshold value, the voltage change amount is updated by (ΔVbas=ΔVbas+ΔV). For example, in a case of ΔV32=200 mV, updated ΔVbas is equal to ΔVbas=160 mV+200 mV=360 mV.

The estimated open-circuit voltage OCVcal at a point P36 after the load is increased has a value obtained by adding updated ΔVbas (=360 mV) to the closed-circuit voltage CCV1 at present. For example, the estimated open-circuit voltage OCVcal is determined by (estimated open-circuit voltage OCVcal=closed-circuit voltage CCV1+ΔVbas=2870 mV+360 mV=3230 mV), and (DOD=65%) is detected from the estimated open-circuit voltage OCVcal.

Figure 4:
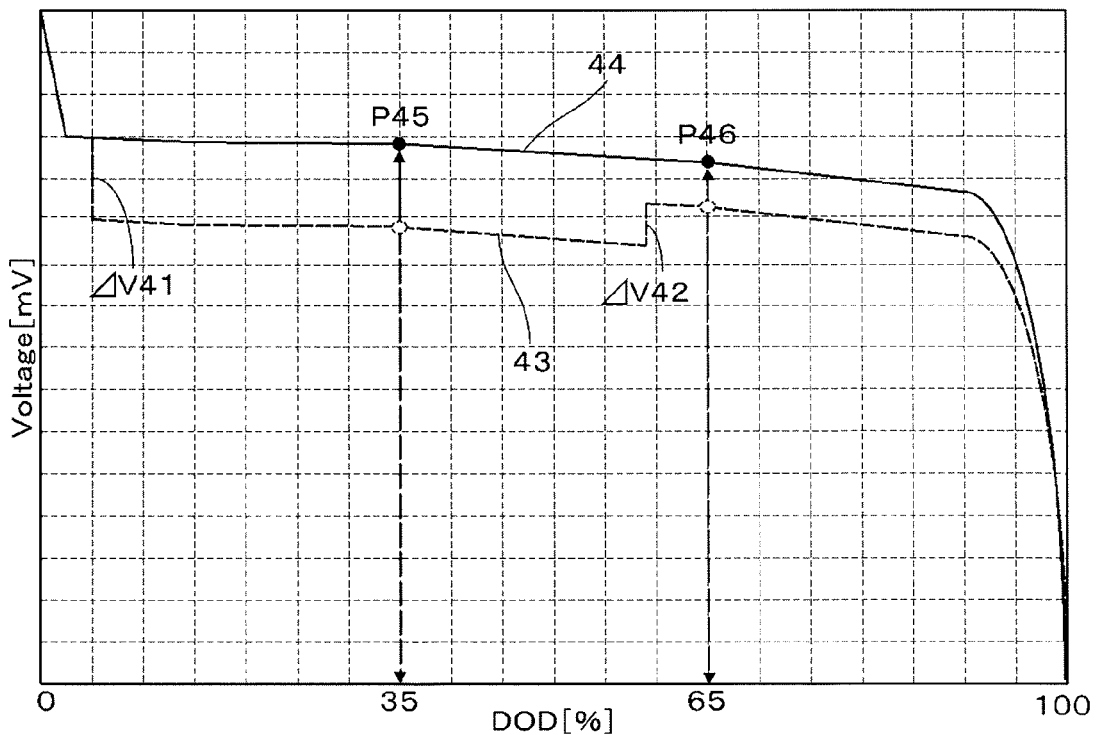
FIG. 4 is a graph for describing a method of detecting a remaining amount when a load is reduced.

Another example of estimation of the open-circuit voltage will be described below referring to FIG. 4. As an example, an open-circuit voltage of one battery block is estimated. FIG. 4 illustrates a case where a load is reduced (gets lighter) during discharge, and change in the closed-circuit voltage represented by a broken line 43 and change in open-circuit voltage represented by a solid line 44 are illustrated. The change (represented by the solid line 44) in the open-circuit voltage with respect to the DOD (remaining amount) corresponds to a lookup table determined and stored in advance.

The change in the open-circuit voltage corresponds to a measured temperature. The open-circuit voltage is estimated, and the DOD is allowed to be determined by the estimated open-circuit voltage.

First, the open-circuit voltage OCV1 before the load is connected (before discharge starts) is measured. For example, OCV1 is equal to 3300 mV. When the load is connected, and discharge starts, the measured voltage is reduced by $\Delta V41$. The voltage $\Delta V41$ is the voltage change amount $\Delta Vbas$ from the state where no load is applied to the state where a load is applied. For example, $\Delta V41$ is equal to (3300 mV−3100 mV=200 mV).

The closed-circuit voltage CCV1 at a point P45 after the load is connected is measured. For example, CCV1 is equal to 3060 mV. For example, a cycle of voltage measurement is extremely short, as described above, and in FIG. 4, only representative points are illustrated. When the closed-circuit voltage at a measurement point previous to the point P45 is considered as CCV2, under a state where the load is not changed, the voltage change amount is determined by ($\Delta V$=CCV2−CCV1). The voltage change amount is smaller than the threshold value; therefore, the estimated open-circuit voltage OCVcal at the point P45 is determined by (CCV1+$\Delta Vbas$=3060 mV+200 mV=3260 mV). With reference to the lookup table, (DOD=35%) is detected from the estimated open-circuit voltage OCVcal.

When the load is changed during discharge, for example, when the load is decreased, the closed-circuit voltage is increased. An increased amount is represented by $\Delta V42$. Since the voltage change amount $\Delta V42$ is larger than the threshold value, the voltage change amount is updated by ($\Delta Vbas$=$\Delta Vbas$+$\Delta V$). For example, in a case of $\Delta V42$=100 mV, updated $\Delta Vbas$ is equal to $\Delta Vbas$=200 mV−100 mV=100 mV.

The estimated open-circuit voltage OCVcal at a point P46 after the load is reduced has a value obtained by adding updated $\Delta Vbas$ (=100 mV) to the closed-circuit voltage CCV1 at present. For example, the estimated open-circuit voltage OCVcal is determined by (estimated open-circuit voltage OCVcal=closed-circuit voltage CCV1+$\Delta Vbas$=3130 mV+100 mV=3230 mV), and (DOD=65%) is detected from the estimated open-circuit voltage OCVcal.

As described above, in the embodiment of the present disclosure, since a current value is not used, the remaining amount is allowed to be detected without being affected by error in current measurement. Moreover, even if the load is changed, the remaining amount is allowed to be detected accurately. Further, in the embodiment of the present disclosure in which the open-circuit voltage at present is calculated from the closed-circuit voltage at present and the voltage change amount, the open-circuit voltage is allowed to be determined by the above-described method irrespective of the number of changes in load.

(Example of Measurement of Remaining Amount)

Figure 5:
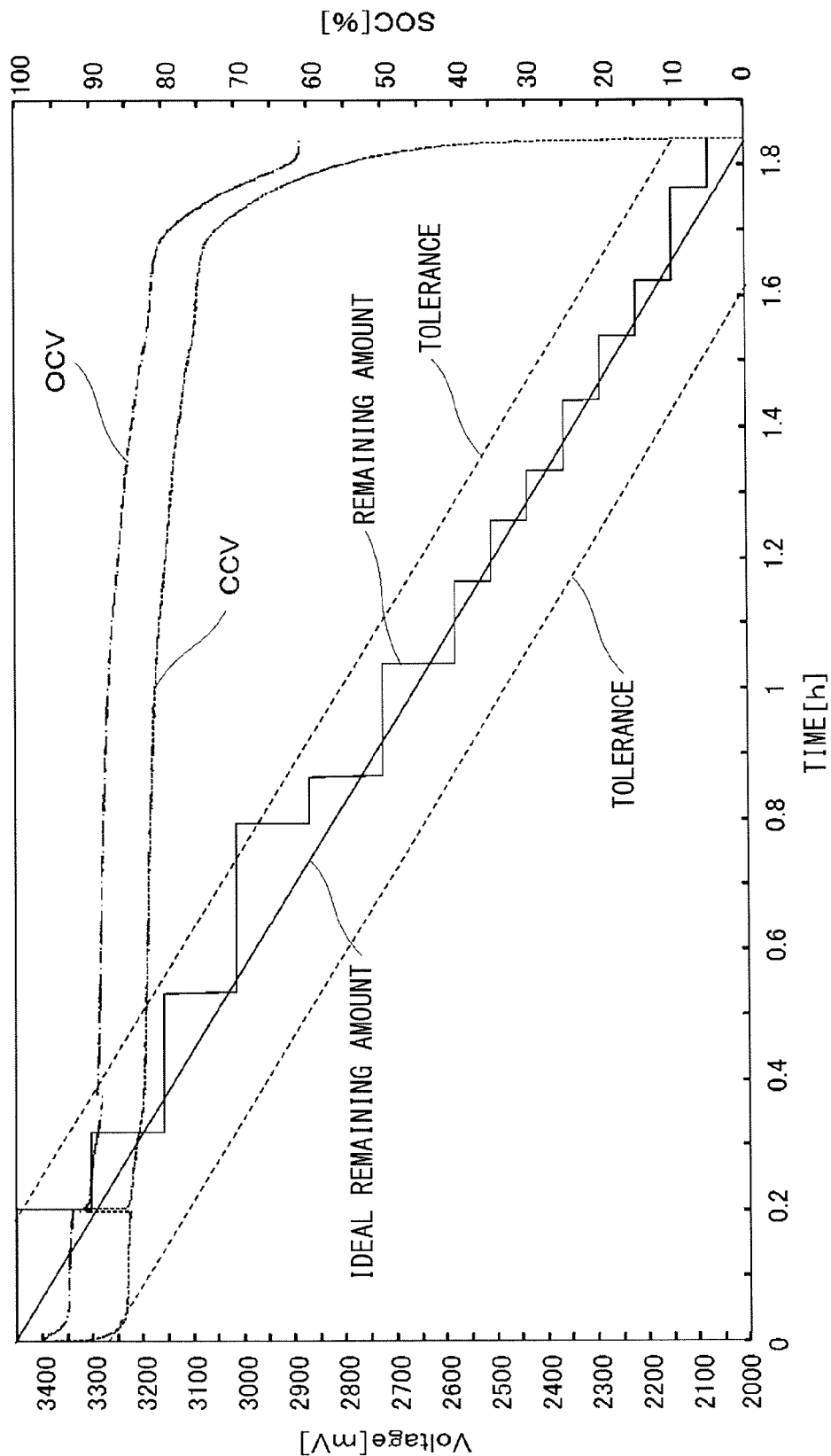
FIG. 5 is a graph of an example of measurement results of an estimated open-circuit voltage, a closed-circuit voltage, and a remaining amount when a load is uniform.

An example of remaining amount measurement results will be described below. FIG. 5 illustrates measurement results in a case where the temperature is uniform, and the load is uniform. A vertical axis represents a closed-circuit voltage value, an estimated open-circuit voltage value, or a SOC. Contrary to the DOD, the SOC is 0% when there is no remaining amount, and is 100% when the remaining amount is at maximum. A horizontal axis represents time.

When a predetermined battery is discharged at a predetermined discharge current of 0.2 C (for example, 2.5 A), as ideal change in remaining amount, the remaining amount is reduced along a constant slope as represented by a solid line. The remaining amount detected by the method in the embodiment of the present disclosure is reduced in a stepwise fashion. A broken line represents a range of tolerance. The tolerance is, for example, within a range of about ±5%. As can be seen from the example in FIG. 5, the remaining amount detected by the method in the embodiment of the present disclosure virtually falls within the range of tolerance to the ideal change.

Figure 6:
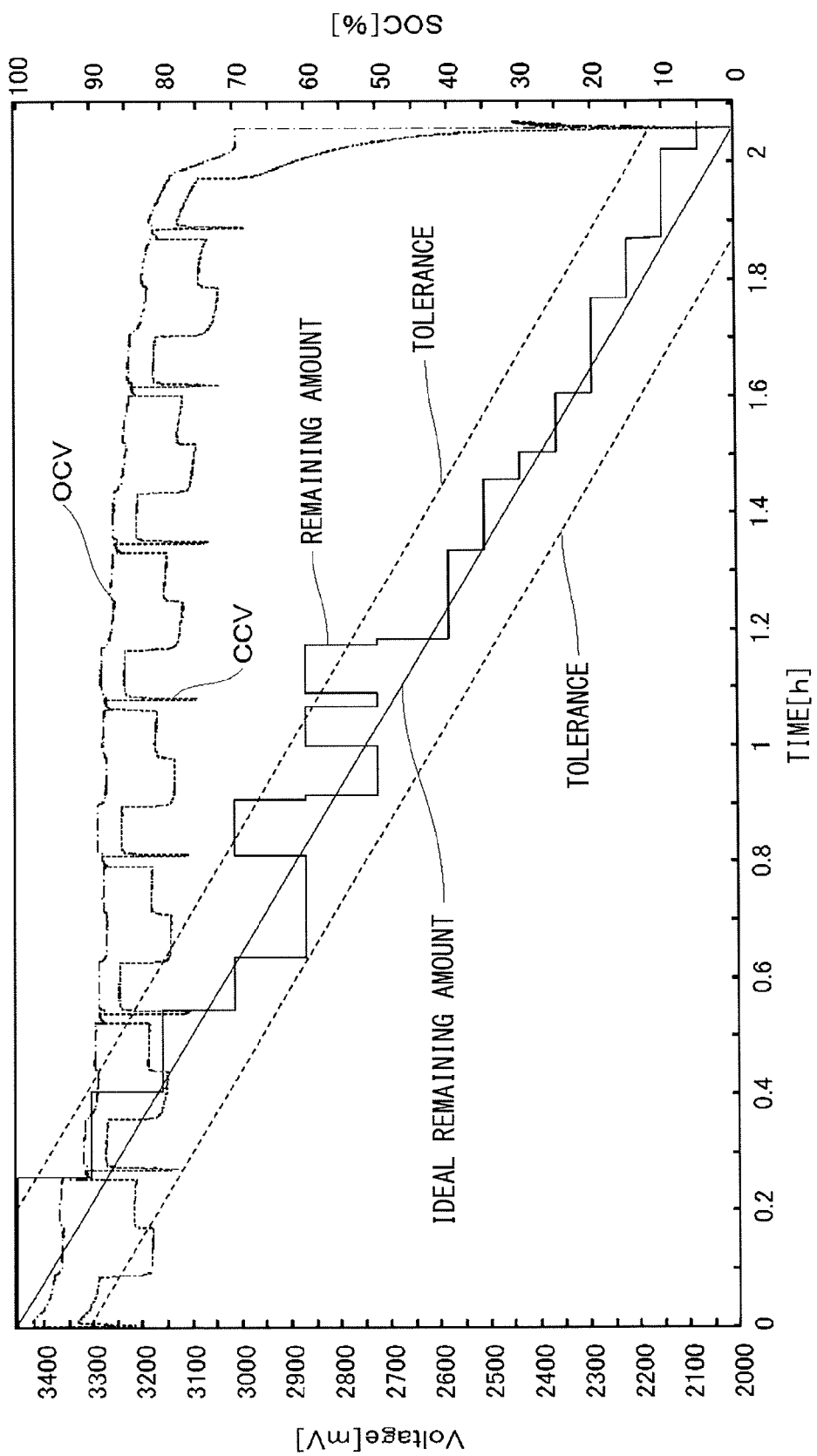
FIG. 6 is a graph of an example of measurement results of an estimated open-circuit voltage, a closed-circuit voltage, and a remaining amount when a load is changed.

FIG. 6 illustrates measurement results in a case where the load is changed. As an example in which the load is changed, a discharge current is changed to 12.5 A, 8.75 A, 6.25 A, and 0 A in this order, and the discharge current is periodically changed. Although the remaining amount measured by the method in the embodiment of the present disclosure is slightly deviated from the tolerance, the remaining amount is allowed to be measured.

(Electric Storage System for House as an Application Example)

Figure 7:
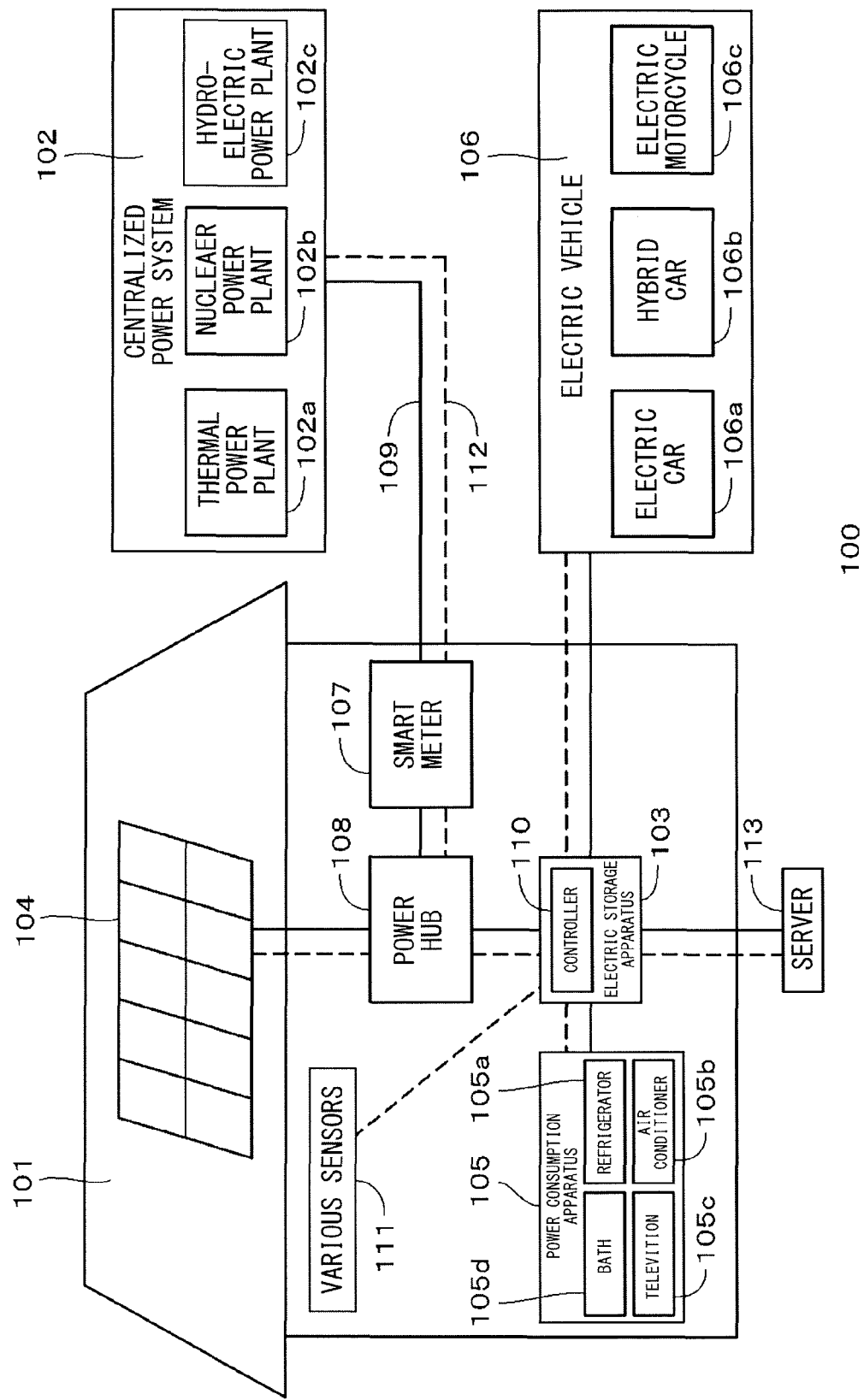
FIG. 7 is a block diagram for describing an application example of the embodiment of the present disclosure.

An example in which the embodiment of the present disclosure is applied to an electric storage system for house will be described referring to FIG. 7. For example, in an electric storage system 100 for a house 101, electric power is supplied to an electric storage apparatus 103 from a centralized power system 102 including a thermal power plant 102*a*, a nuclear power plant 102*b*, a hydroelectric power plant 102*c*, and the like through an electric power network 109, an information network 112, a smart meter 107, a power hub 108, and the like. Along with this, electric power is supplied to the electric storage apparatus 103 from an independent power source such as an in-home generator 104. Electric power supplied to the electric storage apparatus 103 is stored in the electric storage apparatus 103. Electric power to be used in the house 101 is supplied with use of the electric storage apparatus 103. A similar electric storage system may be used not only in the house 101 but also in a building.

The house 101 includes the generator 104, electric power consumption apparatuses 105, the electric storage apparatus 103, a controller 110 controlling respective apparatuses, the smart meter 107, and sensors 111 obtaining various kinds of information. The apparatuses are connected through the electric power network 109 and the information network 112. As the generator 104, a solar battery, a fuel cell, or the like is used, and electric power generated by the generator 104 is supplied to the electric power consumption apparatuses 105 and/or the electric storage apparatus 103. The electric power consumption apparatuses 105 include a refrigerator 105*a*, an air conditioner 105*b*, a television receiver 105*c*, a bath 105*d*, and the like. The electric power consumption apparatuses 105 further include electric vehicles 106. The electric vehicles 106 include an electric car 106*a*, a hybrid car 106*b*, and an electric motorcycle 106*c*.

The above-described remaining amount measurement unit according to the embodiment of the present disclosure is applied to the electric storage apparatus 103; therefore, the remaining amount of the battery unit is allowed to be detected. The electric storage apparatus 103 is configured of a secondary battery or a capacitor. For example, the electric storage apparatus 103 may be configured of, for example, a lithium-ion battery. The lithium-ion battery may be of a stationary type, or may be used in the electric vehicle 106. The smart meter 107 has a function of measuring a used amount of commercial electric power, and then transmitting the measured used amount to an electric power company. The electric power network 109 may be of a DC electric power feeding type, an AC electric power feeding type, or a contactless electric power feeding type, or a combination of two or more types selected from them.

Examples of various sensors 111 may include a human presence sensor, an illumination sensor, an object detection sensor, an electric power consumption sensor, a vibration sensor, a contact sensor, a temperature sensor, and an infrared sensor. Information obtained by the various sensors 111 is transmitted to the controller 110. Weather conditions, a state of a person, and the like are obtained from the information from the sensors 111, and the electric power consumption apparatuses 105 are automatically controlled to minimize energy consumption. In addition, the controller 110 is allowed to transmit information about the house 101 to an external electric power company and the like through the Internet.

Processing such as electric power line branching and DC-to-AC conversion is performed by the power hub 108. As a communication system for the information network 112 connected to the controller 110, a method of using a communication interface such as UART (Universal Asynchronous Receiver-Transceiver), or a method of using a sensor network based on a wireless communication standard such as Bluetooth (registered trademark), ZigBee, or Wi-Fi may be adopted. A Bluetooth (registered trademark) system may be applied to multimedia communication to perform point-to-multipoint communication. A ZigBee system uses a physical layer of IEEE (Institute of Electrical and Electronics Engineers) 802.15.4. IEEE 802.15.4 is a standard for short-range wireless communication standard called personal area network (PAN) or wireless (W) PAN.

The controller 110 is connected to an external server 113. The server 113 may be managed by the house 101, the electric power company, or a service provider. Examples of information transmitted or received by the server 113 include electric power consumption information, life pattern information, electric power rates, weather information, natural disaster information, and electric power trading information. Such information may be transmitted and received by an electric power consumption apparatus in a house (for example, a television receiver), and may be transmitted and received by an apparatus (for example, a cellular phone) outside the house. Such information may be displayed on an apparatus having a display function, for example, a television receiver, a cellular phone, or a PDA (Personal Digital Assistant).

The controller 110 controlling respective components is configured of a CPU (Central Processing Unit), a RAM (Random Access Memory), a ROM (Read Only Memory), and the like, and in this example, the controller 110 is contained in the electric storage apparatus 103. The controller 110 is connected to the electric storage apparatus 103, the in-home generator 104, the electric power consumption apparatuses 105, the various sensors 111, and the server 113 through the information network 112, and has a function of managing a used amount of commercial electric power and an electric power generation amount. It is to be noted that the controller 110 may have a function of performing electric power trading in an electric power market, or the like.

As described above, not only electric power generated by the centralized power system 102 including the thermal power plant 102a, the nuclear power plant 102b, the hydroelectric power plant 102c, and the like but also electric power generated by the in-home generator 104 (a solar power generation unit or a wind power generation unit) may be stored in the electric storage apparatus 103. Therefore, even if electric power generated by the in-home generator 104 varies, control may be performed to fix the amount of electric power that is to be transmitted to an external unit, or to discharge a necessary amount of electric power. For example, while electric power obtained by solar power generation unit is stored in the electric storage apparatus 103, nighttime electric power of which the rate is lower may be stored in the electric storage apparatus 103 during nighttime, and electric power stored in the electric storage device 103 may be discharged and used in a daytime zone in which the rate of electric power is higher.

It is to be noted that, in this example, the controller 110 contained in the electric storage apparatus 103 is described; however, the controller 110 may be contained in the smart meter 107 or, may be configured in isolation. Moreover, the electric storage system 100 may be used for a plurality of households in collective housing, or a plurality of detached houses.

(Electric Storage System for Vehicle as Application Example)

Figure 8:
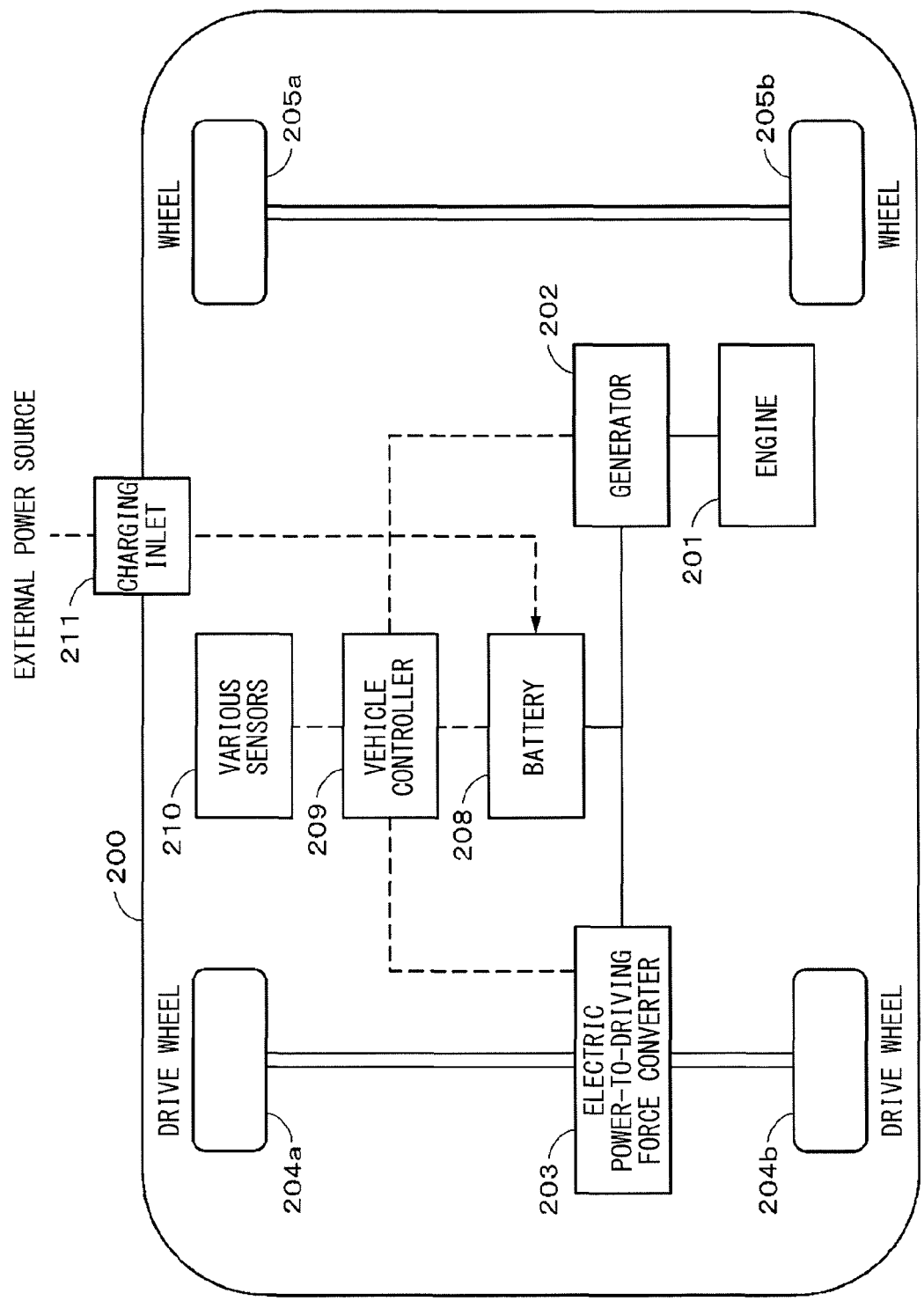
FIG. 8 is a block diagram for describing another application example of the embodiment of the present disclosure.

An application example of the embodiment of the present disclosure to an electric storage system for vehicle will be described below referring to FIG. 8. FIG. 8 schematically illustrates an example of a configuration of a hybrid vehicle adopting a series hybrid system to which the embodiment of the present disclosure is applied. The vehicle adopting the series hybrid system is a car running by an electric power-to-driving force converter with use of electric power generated by a generator driven by an engine or electric power generated by the generator and then temporarily stored in a battery.

A hybrid vehicle 200 includes an engine 201, a generator 202, an electric power-to-driving force converter 203, a drive wheel 204a, a drive wheel 204b, a wheel 205a, a wheel 205b, a battery 208, a vehicle controller 209, various sensors 210, and a charging inlet 211. The above-described remaining amount measurement unit according to the embodiment of the present disclosure is applied to the battery 208, thereby allowing the remaining amount of the battery unit to be detected.

The hybrid vehicle 200 runs with use of the electric power-to-driving force converter 203 as a power source. An example of the electric power-to-driving force converter 203 is a motor. The electric power-to-driving force converter 203 is activated with use of electric power of the battery 208, and torque of the electric power-to-driving force converter 203 is transmitted to the drive wheels 204a and 204b. It is to be noted that either an AC motor or a DC motor is applicable as the electric power-to-driving force converter 203 by using direct current-to-alternating current (DC-to-AC) conversion or reverse conversion (AC-to-DC conversion) at a necessary point. Various sensors 210 control the number of engine revolutions through the vehicle controller 209, or control the degree of opening (throttle opening) of a throttle valve (not illustrated). Various sensors 210 include a speed sensor, an accelerating sensor, an engine revolution sensor, and the like.

The torque of the engine 201 is transmitted to the generator 202, and electric power generated by the generator 202 with use of the torque is allowed to be stored in the battery 208.

When the hybrid vehicle 200 is decelerated by a braking mechanism (not illustrated), resistance generated during deceleration is applied to the electric power-to-driving force converter 203 as torque, and the regenerative electric power generated by the torque in the electric power-to-driving force converter 203 is stored in the battery 208.

When the battery 208 is connected to, for example, an external power source of the hybrid vehicle 200, the battery 208 is allowed to receive electric power from the external power source through the charging inlet 211 as an inlet, and to hold the received electric power accordingly.

Although not illustrated, an information processing unit that performs information processing relating to vehicle control based on information on a secondary battery may be included. Examples of such an information processing unit may include an information processing unit that displays a remaining amount of a battery based on information on the remaining amount of the battery.

It is to be noted that a series hybrid car that runs on a motor with use of electric power generated by a generator actuated by an engine or electric power temporarily stored in the battery is described as an example. However, the embodiment of the present disclosure is effectively applicable to a parallel hybrid vehicle that takes both engine output and motor output as driving sources, and appropriately switches between three modes, i.e., a mode in which the vehicle runs on an engine only, a mode in which the vehicle runs on a motor only, and a mode in which the vehicle runs on both the engine and the motor. Further, the embodiment of the present disclosure is effectively applicable to a so-called electric vehicle that runs on a driving motor only without using an engine.

It is to be noted that the present disclosure may have the following configurations.

(1) A battery remaining amount detection unit including:

a voltage measurement section configured to measure a voltage of a battery;

an open-circuit voltage calculation section configured to calculate an estimated open-circuit voltage; and a remaining amount detection section configured to detect a remaining amount of the battery from the estimated open-circuit voltage, in which the open-circuit voltage calculation section is configured to calculate a first voltage change amount as a voltage change amount from a no-load voltage when no load is applied to the battery and a closed-circuit voltage when a load is applied to the battery, and the open-circuit calculation section is configured to calculate the estimated open-circuit voltage based on the closed-circuit voltage of the battery and the first voltage change amount.

(2) The battery remaining amount detection unit according to (1), in which the open-circuit voltage calculation section is configured to calculate a second voltage change amount as a closed-circuit voltage change amount of the battery when a load different from the load is applied to the battery, and the open-circuit voltage calculation section is configured to calculate the estimated open-circuit voltage based on the closed-circuit voltage of the battery, the second voltage change amount, and the first voltage change amount.

(3) The battery remaining amount detection unit according to (1) or (2), in which when the second voltage change amount is smaller than a threshold value, the open-circuit voltage calculation section considers, as the estimated open-circuit voltage, a value obtained by adding the first voltage change amount to the closed-circuit voltage of the battery, and when the second voltage change amount is equal to or larger than the threshold value, the open-circuit voltage calculation section considers, as the estimated open-circuit voltage, a value obtained by adding the first voltage change amount and the second voltage change amount to the closed-circuit voltage of the battery.

(4) The battery remaining amount detection unit according to any one of (1) to (3), further including a temperature measurement section configured to measure a temperature of the battery, in which the remaining amount detection section is configured to detect the remaining amount from the estimated open-circuit voltage and the measured temperature.

(5) The battery remaining amount detection unit according to any one of (1) to (4), in which the remaining amount detection section has a table representing a relationship between an open-circuit voltage and a remaining amount by temperature, and applies an estimated open-circuit voltage calculated by the open-circuit voltage calculation section and the temperature measured by the temperature measurement section to the table to detect the remaining amount.

(6) The battery remaining amount detection unit according to any one of (1) to (5), in which the table is data measured in advance before shipment.

(7) The battery remaining amount detection unit according to any one of (1) to (6), in which information on the remaining amount detected by the remaining amount detection section is presented.

(8) The battery remaining amount detection unit according to any one of (1) to (7), in which the battery is a battery block configured of a plurality of batteries connected to one another in parallel, and a remaining amount of a battery having a smallest remaining amount among the plurality of batteries is detected.

(9) The battery remaining amount detection unit according to any one of (1) to (8), in which change in the closed-circuit voltage is caused by change in load, and the load is a motor.

(10) An electric vehicle including:

a voltage measurement section configured to measure a voltage of a battery for generating a driving force of a vehicle;

an open-circuit voltage calculation section configured to calculate an estimated open-circuit voltage; and a remaining amount detection section configured to detect a remaining amount of the battery from the estimated open-circuit voltage, in which the open-circuit voltage calculation section is configured to calculate a first voltage change amount as a voltage change amount from a no-load voltage when no load is applied to the battery and a closed-circuit voltage when a load is applied to the battery, and the open-circuit calculation section is configured to calculate the estimated open-circuit voltage based on the closed-circuit voltage of the battery and the first voltage change amount.

(11) An electric power supply unit including:

a voltage measurement section configured to measure a voltage of a battery used to generate AC electric power;

an open-circuit voltage calculation section configured to calculate an estimated open-circuit voltage; and a remaining amount detection section configured to detect a remaining amount of the battery from the estimated open-circuit voltage, in which the open-circuit voltage calculation section is configured to calculate a first voltage change amount as a voltage change amount from a no-load voltage when no load is applied to the battery and a closed-circuit voltage when a load is applied to the battery, and the open-circuit calculation section is configured to calculate the estimated open-circuit voltage based on the closed-circuit voltage of the battery and the first voltage change amount.

Modifications

Although the embodiments of the present disclosure are specifically described, the present disclosure is not limited to the above-described embodiments, and may be variously modified within a range not departing from the gist of the present disclosure. For example, configurations, methods, processes, shapes, materials, numerical values, and the like described in the above-described embodiment are mere examples, and different configurations, methods, processes, shapes, materials, numerical values, and the like may be used, if necessary.

Moreover, the configurations, methods, processes, shapes, materials, numerical values, and the like in the above-described embodiment may be used in combination without departing from the gist of the present disclosure.

As an example, in a case where the present disclosure is applied to an electric vehicle, the battery is discharged by rotation of a motor during normal driving or the like. When a regenerative brake or the like is used to stop the rotation of the motor, the regenerative brake generates regenerative electric power, and the battery is allowed to be charged by the regenerative electric power. The present disclosure is applicable to detection of a remaining amount of a battery charged by the regenerative electric power.

It should be understood by those skilled in the art that various modifications, combinations, sub-combinations, and alterations may occur depending on design requirements and other factors insofar as they are within the scope of the appended claims or the equivalents thereof.

What is claimed is:

1. A battery remaining amount detection unit comprising:
    a voltage measurement section configured to measure a voltage of a battery;
    an open-circuit voltage calculation section configured to calculate an estimated open-circuit voltage; and
    a remaining amount detection section configured to detect a remaining amount of the battery from the estimated open-circuit voltage,
    wherein the open-circuit voltage calculation section is configured to:
        calculate a first voltage change amount as a voltage change amount from an open-circuit voltage in case load is not applied to the battery and a closed-circuit voltage in case a first load is applied to the battery,
        calculate a second voltage change amount as a closed-circuit voltage change amount of the battery in case a second load different from the first load is applied to the battery, and
        calculate the estimated open-circuit voltage based on the closed circuit voltage of the battery, the first voltage change amount, and a comparison of the second voltage change amount with a threshold value, the threshold value being set as a percentage value of the closed-circuit voltage of the battery.

2. The battery remaining amount detection unit according to claim 1, wherein
    the open-circuit voltage calculation section is configured to calculate the estimated open-circuit voltage based on the closed-circuit voltage of the battery, the second voltage change amount, and the first voltage change amount.

3. The battery remaining amount detection unit according to claim 1, wherein
    in case the second voltage change amount is smaller than the threshold value, the open-circuit voltage calculation section considers, as the estimated open-circuit voltage, a value obtained by adding the first voltage change amount to the closed-circuit voltage of the battery, and
    in case the second voltage change amount is equal to or larger than the threshold value, the open-circuit voltage calculation section considers, as the estimated open-circuit voltage, a value obtained by adding the first voltage change amount and the second voltage change amount to the closed-circuit voltage of the battery.

4. The battery remaining amount detection unit according to claim 1, further comprising a temperature measurement section configured to measure a temperature of the battery,
    wherein the remaining amount detection section is configured to detect the remaining amount from the estimated open-circuit voltage and the measured temperature.

5. The battery remaining amount detection unit according to claim 4, wherein the remaining amount detection section includes a table representing a relationship between the open-circuit voltage and a remaining amount by temperature, and the remaining amount detection section is configured to apply the estimated open-circuit voltage calculated by the open-circuit voltage calculation section and the temperature measured by the temperature measurement section to the table to detect the remaining amount.

6. The battery remaining amount detection unit according to claim 5, wherein the table is data measured in advance before shipment.

7. The battery remaining amount detection unit according to claim 1, wherein information on the remaining amount detected by the remaining amount detection section is presented.

8. The battery remaining amount detection unit according to claim 1, wherein the battery is a battery block configured of a plurality of batteries connected to one another in parallel, and a remaining amount of a battery having a smallest remaining amount among the plurality of batteries is detected.

9. The battery remaining amount detection unit according to claim 1, wherein change in the closed-circuit voltage is caused by change in load, and the load is a motor.

10. An electric vehicle comprising:
    a voltage measurement section configured to measure a voltage of a battery for generating a driving force of a vehicle;
    an open-circuit voltage calculation section configured to calculate an estimated open-circuit voltage; and
    a remaining amount detection section configured to detect a remaining amount of the battery from the estimated open-circuit voltage,
    wherein the open-circuit voltage calculation section is configured to:
        calculate a first voltage change amount as a voltage change amount from an open-circuit voltage in case load is not applied to the battery and a closed-circuit voltage in case a first load is applied to the battery,
        calculate a second voltage change amount as a closed-circuit voltage change amount of the battery in case a second load different from the first load is applied to the battery, and
        calculate the estimated open-circuit voltage based on the closed-circuit voltage of the battery, the first voltage change amount, and a comparison of the second voltage change amount with a threshold value, the threshold value being set as a percentage value of the closed-circuit voltage of the battery.

11. An electric power supply unit comprising:
a voltage measurement section configured to measure a voltage of a battery used to generate AC electric power;
an open-circuit voltage calculation section configured to calculate an estimated open-circuit voltage; and
a remaining amount detection section configured to detect a remaining amount of the battery from the estimated open-circuit voltage,
wherein the open-circuit voltage calculation section is configured to:
  calculate a first voltage change amount as a voltage change amount from an open-circuit voltage in case load is not applied to the battery and a closed-circuit voltage in case a first load is applied to the battery,
  calculate a second voltage change amount as a closed-circuit voltage change amount of the battery in case a second load different from the first load is applied to the battery, and
  calculate the estimated open-circuit voltage based on the closed-circuit voltage of the battery, the first voltage change amount, and a comparison of the second voltage change amount with a threshold value, the threshold value being set as a percentage value of the closed-circuit voltage of the battery.

12. The battery remaining amount detection unit according to claim 1, wherein the threshold value for the second voltage change amount is set to 1% of the closed-circuit voltage of the battery.

* * * * *